United States Patent [19]
McKinnon

[11] Patent Number: 6,078,176
[45] Date of Patent: Jun. 20, 2000

[54] FAST SPIN ECHO PULSE SEQUENCE FOR DIFFUSION WEIGHTED IMAGING

[75] Inventor: Graeme C. McKinnon, Hartland, Wis.

[73] Assignee: General Electric Company, Milwaukee, Wis.

[21] Appl. No.: 09/023,572

[22] Filed: Feb. 13, 1998

Related U.S. Application Data

[63] Continuation-in-part of application No. 08/745,602, Nov. 8, 1996, abandoned.

[51] Int. Cl.$^7$ .................................................. G01V 3/00
[52] U.S. Cl. ............................................. 324/309; 324/307
[58] Field of Search ................................ 324/309, 307, 324/306, 312, 314, 300

[56] References Cited

U.S. PATENT DOCUMENTS

| | | | |
|---|---|---|---|
| 5,317,262 | 5/1994 | Moonen et al. | 324/309 |
| 5,864,233 | 1/1999 | Zhou et al. | 324/309 |

OTHER PUBLICATIONS

SPLICE: Sub–Second Diffusion–Sensitive MR Imaging Using A Modified Fast Spin–Echo Acquisition Mode, MRM 38:638–644 (1997), Fritz Schick. (Mar. 1997).

On the Application of Ultra–fast RARE Experiments, MRM 27, 142–164 (1992), Norris, et al. (Jan. 1992).

Phase Insensitive Preparation of Single–Shot RARE: Application to Diffusion Imaging in Humans, MRM 38:527–533 (1997), David C. Alsop. (May 1997).

*Primary Examiner*—Louis Arana
*Attorney, Agent, or Firm*—Quarles & Brady; Christian G. Cabou; Phyllis Y. Price

[57] ABSTRACT

In an MRI system a diffusion weighted fast spin echo (FSE) pulse sequence is employed to acquire data for producing an image. Each FSE pulse sequence is prefaced by a diffusion weighting pulse sequence, and components of the diffusion weighted spin magnetization that produce image artifacts are suppressed by a combination of gradient pulses and an RF pulse applied before the FSE pulse sequence is performed.

11 Claims, 4 Drawing Sheets

FAST SPIN ECHO PULSE SEQUENCE FOR DIFFUSION WEIGHTED IMAGING

RELATED PATENT APPLICATION

This application is a continuation-in-part of pending U.S. patent application Ser. No. 08/745,602 filed on Nov. 8, 1996 and entitled "Phase Insensitive Fast Spin Echo MR Imaging", now abandoned.

BACKGROUND OF THE INVENTION

The field of the invention is nuclear magnetic resonance imaging methods and systems. More particularly, the invention relates to an improved fast spin echo pulse sequence for use in diffusion weighted MR imaging.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant y of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$ may be rotated, or "tipped", into the x-y plane to produce a net transverse magnetic moment $M_t$, which is rotating, or spinning, in the xy plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field Bo, but which have a gradient along the respective x, y and z axes. By controlling the strength of these gradients during each NMR cycle, the spatial distribution of spin excitation can be controlled and the location of the resulting NMR signals can be identified.

Most NMR scans currently used to produce medical images require many minutes to acquire the necessary data. The reduction of this scan time is an important consideration, since reduced scan time increases patient throughput, improves patient comfort, and improves image quality by reducing motion artifacts.

The concept of acquiring NMR image data in a short time period has been known since 1977 when the echo-planar pulse sequence was proposed by Peter Mansfield (J. Phys. C.10: L55L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging ("EPI") are well-known, and a number of variations on this pulse sequence are disclosed in U.S. Pat. Nos. 4,678,996; 4,733,188; 4,716,369; 4,355,282; 4,588,948 and 4,752,735. Unfortunately, even when state-of-the-art fast gradient systems are used, the EPI pulse sequence has difficulties with eddy current dependent and susceptibility induced image distortions.

A variant of the echo planar imaging method is the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The essential difference between the RARE sequence and the EPI sequence lies in the manner in which echo signals are produced. The RARE sequence utilizes RF refocused echoes generated from a Carr-Purcell-Meiboom-Gill sequence, while EPI methods employ gradient recalled echoes. This "fast spin echo" pulse sequence is generally considered a problem free technique for acquiring multiple k-space lines with one excitation. It is, for instance, much less sensitive to field inhomogeneities and gradient timing errors than echo planar imaging. Further, because the readout gradient is always positive, unlike echo planar imaging, gradient fidelity is less of a problem.

However there are several critical parameters with the fast spin echo pulse sequence, which, if set incorrectly, can produce considerable image artifacts. These involve the radio frequency (RF) pulse spacing and phase relationships, and also the areas of the readout gradient pulses. Firstly, it is necessary that the time between the centers of the excitation pulse and first refocusing pulse should be half the time between the centers of adjacent refocusing pulses. Secondly, the echoes and the refocusing RF pulses should have the same phase angle. This is usually achieved by setting the phase of the excitation RF pulse to 90° with respect to the phase of the refocusing RF pulses. Related to these requirements is the fact that the area of the readout gradient pulse between the excitation and the first refocusing RF pulse should be equal to half the area of the readout gradient pulse between each of the subsequent refocusing pulses.

For conventional fast spin echo ("FSE") imaging the above critical parameters can be controlled in a relatively straight forward manner. However, there are a number of imaging situations where the required degree of phase control between the rf pulses and the echoes is difficult to achieve. One of these situations is diffusion weighted imaging, where large gradient pulses are employed and resulting eddy currents are more prevalent.

Diffusion weighted imaging employs a pair of large gradient pulses at the beginning of the pulse sequence to sensitize the acquired NMR signals to spin motion. Generally, such imaging is performed using a single shot EPI pulse sequence, however, severe image distortion can occur. One solution as proposed by Butts, et al., in *Magn. Reson. Med.*, 38, 741–749 (1997) is to use a multi-shot EPI acquisition with navigator signals used to correct for phase errors.

Diffusion weighted FSE has been attempted, but the large motion encoding gradients at the beginning of the pulse sequence set up Eddy currents which interfere with the phase relationship between the excitation and refocusing pulses. Norris, et al. Proposed in *Magn. Reson. Med.,* 27, 142–164 (1992) a method for controlling the phase in an FSE pulse sequence which involved separating out two coherence pathways, and using only one of the coherence signals. One problem with this approach is the strong oscillation of the echo signal amplitude which, if uncorrected, causes severe ghosting in the image. A similar idea has been proposed by Shick in *Magn. Reson. Med.,* 38, 638–644 (19997) in which the echo signal amplitude is increased. Alsop discloses in *Magn. Reson. Med.,* 38, 527–533 (1997) a method for reducing the oscillations in the amplitude of these echo signals.

SUMMARY OF THE INVENTION

The present invention relates to an improved fast spin echo sequence, and more particularly, to a fast spin echo pulse sequence for performing diffusion weighted imaging. The present invention is an improvement to a conventional fast spin echo pulse sequence in which a diffusion preparation pulse sequence is performed to produce diffusion weighted transverse spin magnetization, a first dephasing gradient pulse is applied to dephase the transverse spin magnetization, an RF pulse is applied to tip one component of the dephased transverse spin magnetization along the longitudinal axis, a second dephasing gradient pulse is applied to dephase the remaining components of the transverse spin magnetization, and a fast spin echo pulse sequence is performed to produce a series of NMR echo signals from the one component tipped along the longitudinal axis. A gradient pulse is produced after each rf refocusing pulse in the fast spin echo pulse sequence to rephase the diffusion weighted spin magnetization prior to each NMR echo signal acquisition.

A general object of the invention is to suppress image artifacts in a diffusion weighted FSE acquisition. The desired diffusion weighted spin magnetization is "saved" by tipping it into the longitudinal axis. The FSE pulse sequence tips the desired diffusion weighted spin magnetization back into the transverse plane and produces the series of NMR echo signals.

DESCRIPTION OF THE PREFERRED EMBODIMENT

Figure 1:
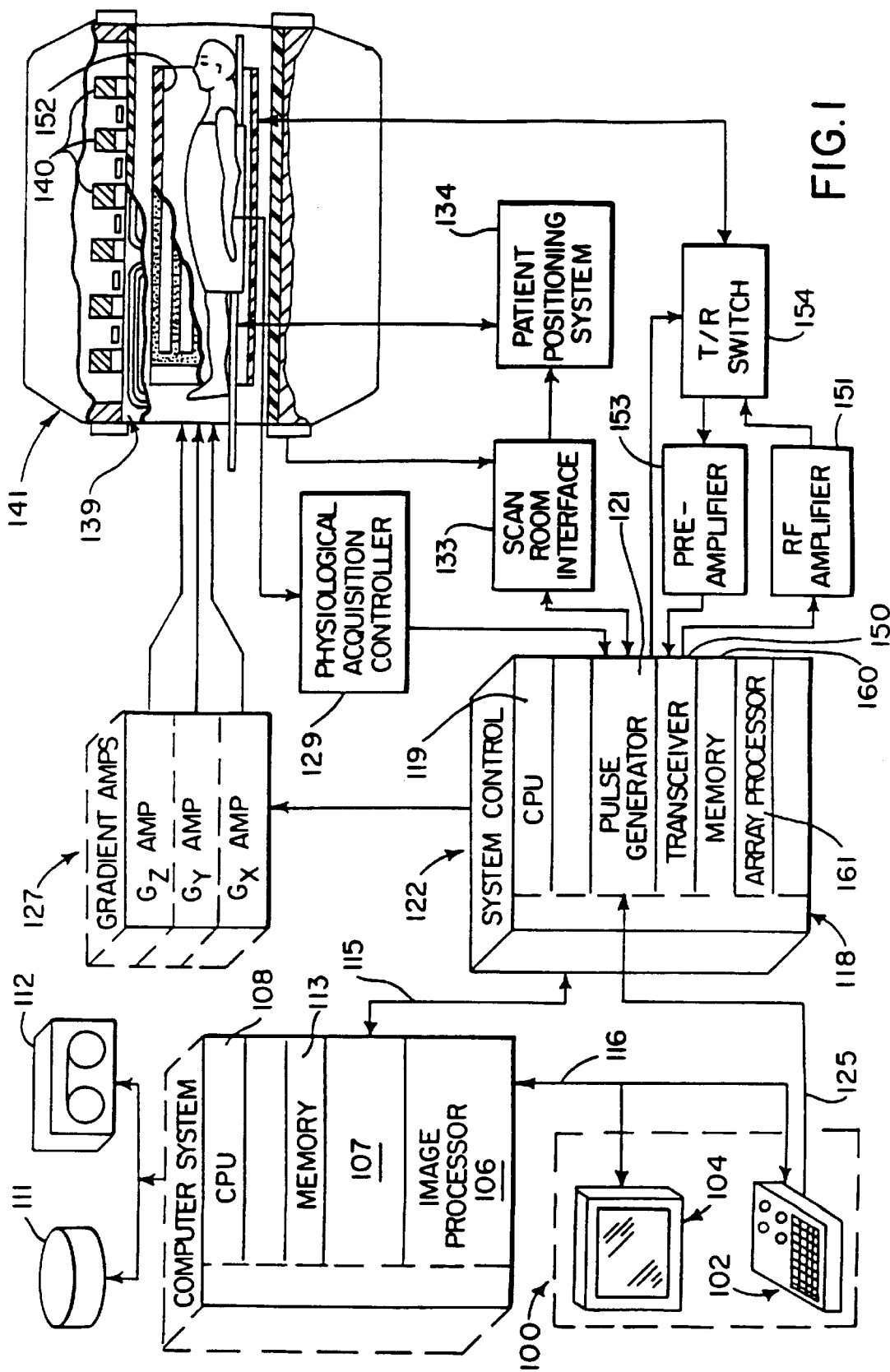
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
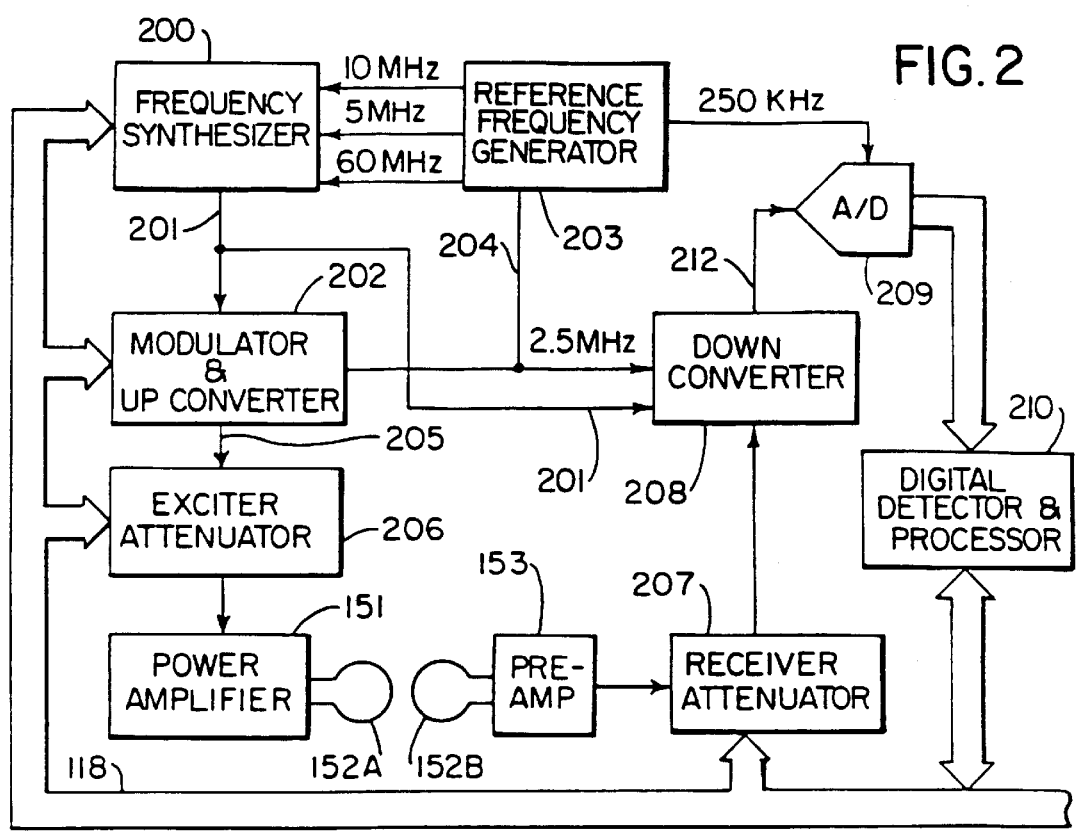
FIG. 2 is an electrical block diagram of the transceiver which forms part of the MRI system of FIG. 1.

Referring particularly to FIGS. 1 and 2, the transceiver 150 produces the RF excitation field B1 through power amplifier 151 at a coil 152A and receives the resulting signal induced in a coil 152B. As indicated above, the coils 152A and B may be separate as shown in FIG. 2, or they may be a single wholebody coil as shown in FIG. 1. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152A. For a more detailed description of this portion of the transceiver 122, reference is made to U.S. Pat. No. 4,952,877 which is incorporated herein by reference.

Referring still to FIG. 1 and 2 the signal produced by the subject is picked up by the receiver coil 152B and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted in a two step process by a down converter 208 which first mixes the NMR signal with the carrier signal on line 201 and then mixes the resulting difference signal with the 2.5 MHz reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output through backplane 118 to the memory module 160 where they are employed to reconstruct an image.

The 2.5 MHz reference signal as well as the 250 kHz sampling signal and the 5, 10 and 60 MHz reference signals are produced by a reference frequency generator 203 from a common 20 MHz master clock signal. For a more detailed description of the receiver, reference is made to U.S. Pat. No. 4,992,736 which is incorporated herein by reference.

Figure 3:
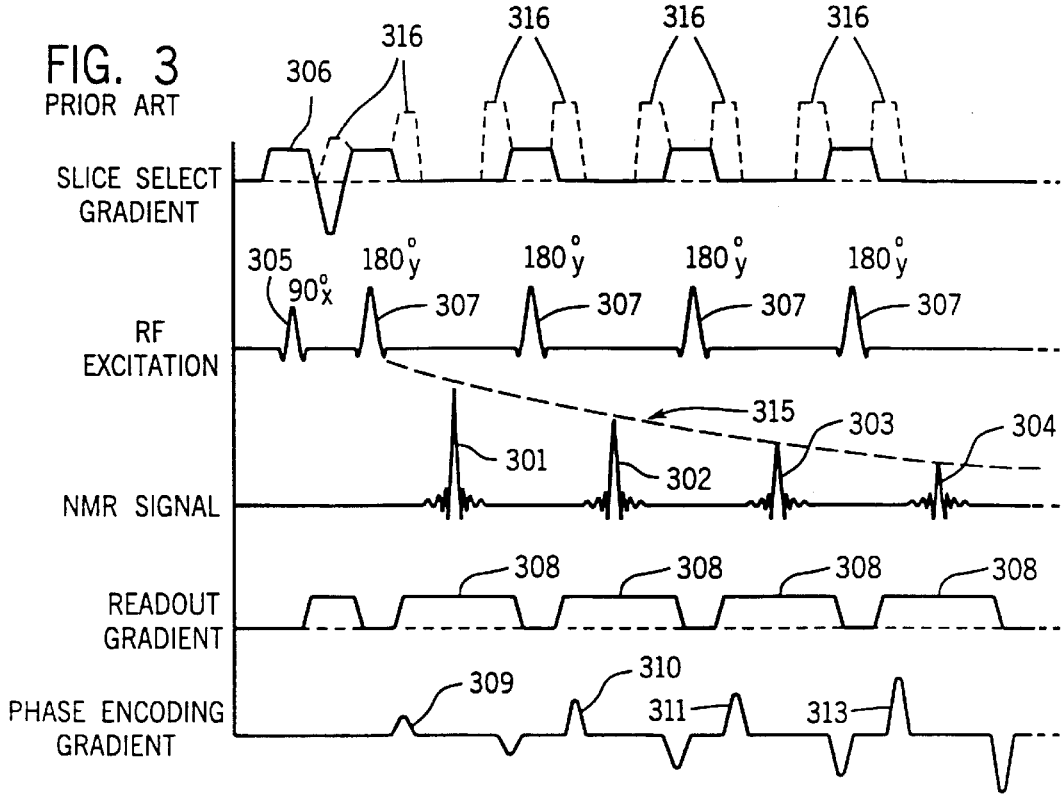
FIG. 3 is a graphic representation of a conventional fast spin echo pulse sequence.

Referring particularly to FIG. 3, a conventional fast spin echo NMR pulse sequence, known as a 2DFT RARE sequence is shown. For clarity, only four echo signals 301–304 are shown in FIG. 3, but it can be appreciated that more are produced and acquired in each "shot". These NMR echo signals are produced by a 90° RF excitation pulse 305 which is generated in the presence of a $G_z$ slice select gradient pulse 306 to tip longitudinal magnetization and provide transverse magnetization in a slice through the patient. This transverse magnetization is refocused by each selective 180° RF refocusing pulse 307 to produce the NMR spin echo signals 301–304 that are acquired in the presence of $G_x$ readout gradient pulses 308. Each NMR spin echo signal 301–304 is separately phase encoded by respective $G_y$ phase encoding pulses 309–313. The magnitude of each phase encoding pulse is different, and it is stepped through 256 values to acquire 256 separate views during a complete scan. This enables an image having 256 separate pixels in the y direction to be reconstructed. Each NMR spin echo signal is acquired by digitizing 256 samples of each signal. As a result, at the completion of a scan for one image, 16 shots (256/16=16) of the pulse sequence of FIG. 3 have been executed and a 256 by 256 element array of complex numbers have been acquired. A variation of this fast spin echo pulse sequence includes crusher gradient pulses 316. These crusher gradients 316 have an equal area and are applied immediately before and after each refocusing RF pulse 307.

An image is reconstructed by performing a 2D Fourier transformation on this image data array and then calculating the absolute value of each resulting complex element. A 256 by 256 pixel image is thus produced in which the brightness of each pixel is determined by the magnitude of its corresponding element in the transformed array.

In the conventional fast spin echo pulse sequence of FIG. 3, the RF excitation pulse 305 has a flip angle of 90° and the RF refocusing pulses are nominally 180° flip angles. In practice, however, other flip angles ranging between 90° and 180° are used. In addition, the notation "90°$_x$" and "180°$_y$" indicates that the RF phase angle between the RF pulse 305 and the refocusing pulses 307 is 90°. This quadrature relationship is important because the echo signals that are produced when this phase relationship is maintained all have the same sign. In contrast, when the RF pulses are all in phase, the echo signals that are produced alternate in sign. Therefore, if the phase angle between the RF excitation pulse 305 and the refocusing pulses 307 is 0°, the echo signal amplitudes will oscillate when 180° refocusing pulses are used. The conventional fast spin echo pulse sequence is, therefore, sensitive to the proper maintenance of the quadrature phase relationships between the RF excitation pulse 305 and the refocusing RF pulses 307.

Figure 5:
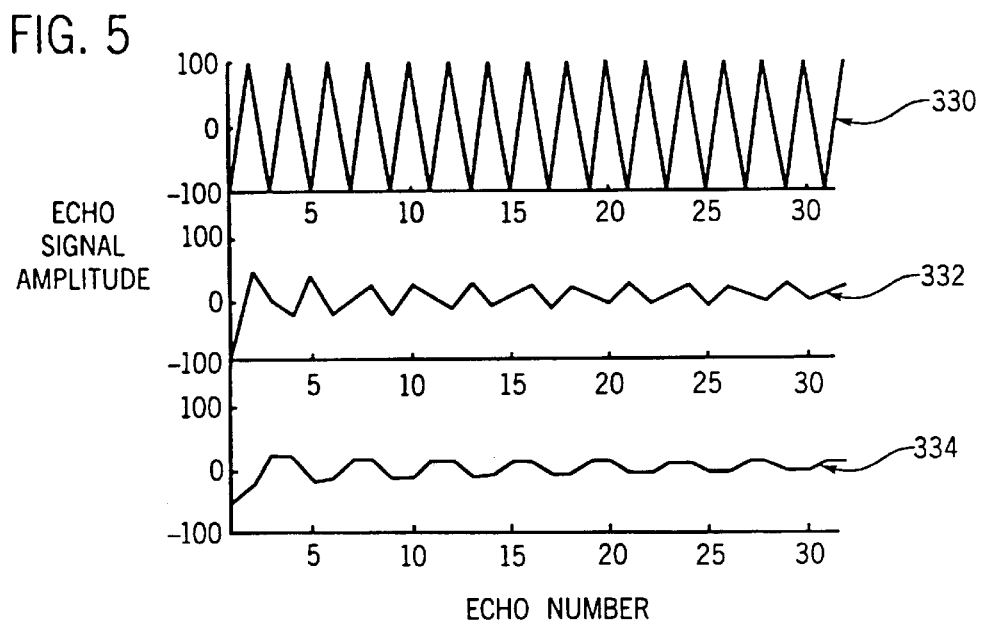
FIG. 5 is a graphic illustration of the variations in echo signal magnitude in a conventional fast spin echo pulse sequence.

This phase sensitivity of a conventional fast spin echo pulse sequence is illustrated in FIG. 5, which shows the effect an "in phase" RF excitation pulse has on the echo signal amplitudes. Curve 330 shows how the echo signal amplitude alternates in sign when a 180° RF refocusing pulse is employed. Curves 332 and 334 illustrate echo signal amplitude when the flip-angle of the RF refocusing pulse is reduced to 135° and 90° respectively. The echo signal amplitudes quickly decay to zero with increasing echo number. This is caused by cancellation between the spin echoes and the stimulated echoes. Also note that the period of the oscillations in signal amplitude is equal to 360° divided by the focusing pulse flip angle.

Figure 4:
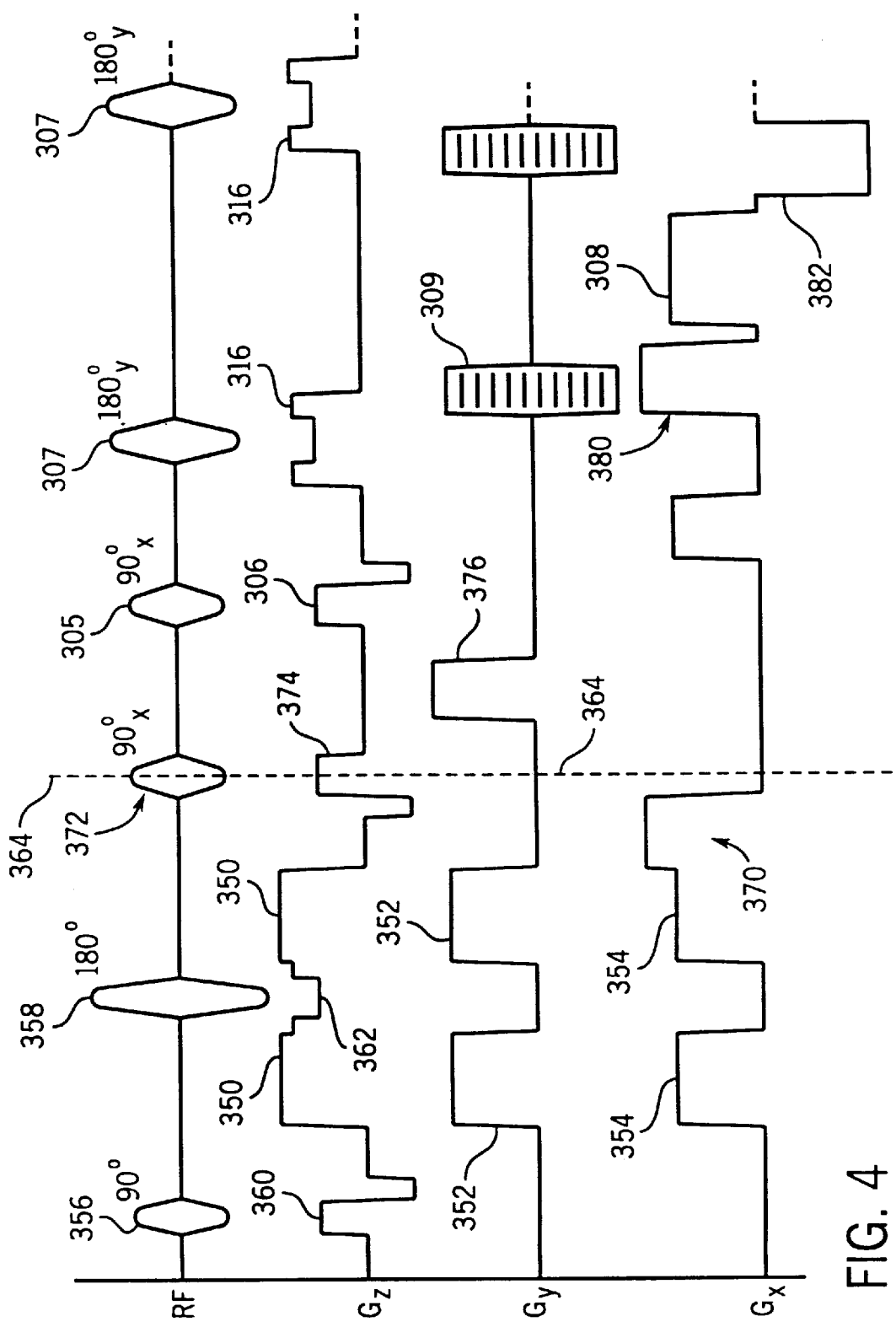
FIG. 4 is a graphic representation of the improved fast spin echo pulse sequence which employs the present invention.

Referring particularly to FIG. 4, the preferred embodiment of the pulse sequence used to practice the present invention is a standard FSE sequence prefaced by a diffusion preparation of the longitudinal magnetization. The diffusion preparation is performed by large motion encoding gradient pulses 350, 352 and 354 along the respective z, y and x gradient axes. These motion encoding gradients 350, 352 and 354 are part of a spin-echo sequence comprised of a selective 90° RF excitation pulse 356 and a selective 180° RF refocusing pulse 358. The RF excitation pulse 356 produces transverse magnetization in a slice location determined by a slice select gradient pulse 360 and the RF pulse 358 refocuses the transverse magnetization in the presence of a second slice select gradient pulse 362. The motion sensitized, transverse magnetization thus refocuses at a time indicated by the dashed line 364.

The fast spin echo (FSE) pulse sequence begins with the 90° RF excitation pulse 305 produced in the presence of a slice select gradient pulse 306. As described above, the 180° RF refocusing pulses 307 and phase encoding gradient pulses 309 are applied at the proper time to produce NMR echo signals (not shown in FIG. 4) that are acquired during readout gradient pulses 308. Only a part of the FSE pulse sequence is shown in FIG. 4 and it can be appreciated by those skilled in the art that it is continued for as many NMR echo signals as are desired in the shot. FSE shots of ETL=40 to 72 are typical in diffusion weighted imaging.

The present invention is an improvement to the above-described pulse sequence in which a dephasing gradient pulse 370 is applied along the readout gradient axis, $G_x$ to dephase the transverse magnetization produced during the diffusion weighting process. This means that within each voxel the transversely magnetized spin phase is spread out over 360 degrees in the transverse (i.e. x,y) plane. A 90° RF pulse 372 is then applied in the presence of a slice select gradient 374 to tip the spin magnetization oriented along the y axis back into the longitudinal z axis. A second dephasing gradient pulse 376 applied along the $G_y$ phase encoding axis is then applied to dephase the residual transverse magnetization remaining in the transverse plane. The 90° RF excitation pulse 305 tips the artifact-free spin magnetization "saved" along the z-axis by the RF pulse 372 back into the transverse plane where it produces NMR echo signals in the Carr-Purcell-Meiboom-Gill sequence.

To refocus just the diffusion weighted components of the transverse magnetization, a rephasing gradient pulse 380 is applied along the $G_x$ readout axis just after each RF refocusing pulse 307. This rephasing gradient pulse 380 suppresses any T1 weighted signal component that might have recovered during the diffusion preparation sequence. In addition, the rephasing gradient pulses 380 are the same size as the dephasing gradient pulse 370. After each diffusion weighted echo signal is acquired, a rewinder gradient pulse 382 of the same size is applied. The rewinder gradients 382 are there to ensure that the CPMG condition, requiring that the gradient area between neighboring refocusing pulses 307 is twice that of the gradient area between the excitation pulse 305 and first refocuser 307, is met.

A number of variations in the preferred embodiment are possible without deviating from the invention. The polarity of the dephasing gradient pulse 370 can be reversed, and the second dephasing gradient pulse 376 can be applied in any direction. The gradient pulses 370, 380 and 382 can also be applied in any direction as long as all three gradients are applied in the same direction. Other variations well known to those skilled in the art, such as using refocusing pulses with flip angles less than 180° are also possible.

What is claimed is:

1. A method for producing a diffusion weighted image with an MRI system, the steps comprising:
   a) performing a diffusion weighting pulse sequence in which transverse magnetization is produced by an rf excitation pulse, and the transverse magnetization is diffusion weighted by application of a bipolar gradient pulse;
   b) dephasing the diffusion weighted transverse magnetization by application of a first gradient pulse;
   c) saving a component of the diffusion weighted transverse magnetization by applying an rf pulse which tips the component into the longitudinal axis;
   d) dephasing transverse magnetization by applying a second gradient pulse;
   e) performing a fast spin echo pulse sequence in which the saved diffusion weighted magnetization is tipped into the transverse plane by an rf excitation pulse, and a series of NMR echo signals are produced by a corresponding series of rf refocusing pulses; and
   f) reconstructing an image from the acquired NMR echo signals.

2. The method as recited in claim 1 in which the bipolar gradient pulse is applied along three axes.

3. The method as recited in claim 1 in which a third gradient pulse is applied during the fast spin echo pulse sequence after each rf refocusing pulse and prior to acquiring the corresponding NMR echo signal, and the size of each of said third gradient pulses is substantially the same as the first gradient pulse.

4. The method as recited in claim 3 in which a fourth gradient pulse is applied during the fast spin echo pulse sequence after each NMR echo signal is acquired, and the size of each of said fourth gradient pulses is substantially the same, but opposite in polarity as the third gradient pulse.

5. The method as recited in claim 4 in which each NMR echo signal is acquired during a readout gradient pulse directed along one gradient axis and a phase encoding gradient pulse directed along a second gradient axis is produced prior to each NMR echo signal.

6. The method as recited in claim 5 in which the bipolar gradient pulse is applied along each of said gradient axes.

7. The method as recited in claim 5 in which the first, third and fourth gradient pulses are directed along the readout gradient axis.

8. The method as recited in claim 7 in which the second gradient pulse is directed along the phase encoding gradient axis.

9. The method as recited in claim 8 in which a slice select gradient pulse is applied during the application of each of said rf excitation pulses and each of said rf refocusing pulses.

10. The method as recited in claim 1 in which the bipolar gradient pulse is comprised of two large gradient pulses of the same polarity and an rf pulse is produced between said two large gradient pulses.

11. The method as recited in claim 1 in which steps a) through e) are repeated to acquire further NMR echo signals for use in reconstructing an image.

* * * * *